(12) United States Patent
Song et al.

(10) Patent No.: US 10,211,391 B2
(45) Date of Patent: Feb. 19, 2019

(54) ELECTRONIC DEVICES HAVING SEMICONDUCTOR MAGNETIC MEMORY UNITS

(71) Applicant: SK hynix Inc., Icheon-Si (KR)

(72) Inventors: Seok-Pyo Song, Icheon-Si (KR); Se-Dong Kim, Icheon-Si (KR); Hong-Ju Suh, Icheon-Si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/946,273

(22) Filed: Apr. 5, 2018

(65) Prior Publication Data

US 2018/0226568 A1    Aug. 9, 2018

Related U.S. Application Data

(60) Division of application No. 14/981,706, filed on Dec. 28, 2015, now Pat. No. 9,941,464, which is a (Continued)

(30) Foreign Application Priority Data

Mar. 4, 2013 (KR) ................. 10-2013-0022810

(51) Int. Cl.
| | | |
|---|---|---|
| *H01L 43/02* | (2006.01) | |
| *G06F 3/06* | (2006.01) | |
| *H01L 29/82* | (2006.01) | |
| *H01L 43/08* | (2006.01) | |
| *H01L 43/12* | (2006.01) | |
| *G06F 12/0802* | (2016.01) | |
| *G11C 11/16* | (2006.01) | |
| *H01L 43/10* | (2006.01) | |
| *H01L 27/22* | (2006.01) | |

(52) U.S. Cl.
CPC .......... *H01L 43/02* (2013.01); *G06F 3/0604* (2013.01); *G06F 3/0629* (2013.01); *G06F 3/0673* (2013.01); *G06F 3/0679* (2013.01); *G06F 12/0802* (2013.01); *G11C 11/161* (2013.01); *H01L 27/222* (2013.01); *H01L 29/82* (2013.01); *H01L 43/08* (2013.01); *H01L 43/10* (2013.01); *H01L 43/12* (2013.01); *G06F 2212/2024* (2013.01); *G06F 2212/222* (2013.01); *H01L 27/226* (2013.01)

(58) Field of Classification Search
CPC ............................ H01L 29/82; H01L 43/08
See application file for complete search history.

(56) References Cited

U.S. PATENT DOCUMENTS

| | | |
|---|---|---|
| 7,211,874 B2 | 5/2007 | Guo et al. |
| 7,523,543 B2 | 4/2009 | Byun et al. |
| | (Continued) | |

OTHER PUBLICATIONS

Woojin Kim et al., ("Extended scalability of perpendicular STT-MRAM towards sub-20-nm MTJ node," IEDM (2011)), pp. 24.1.1-24.1.4.

*Primary Examiner* — Lex Malsawma
*Assistant Examiner* — Xia Cross
(74) *Attorney, Agent, or Firm* — Perkins Coie LLP

(57) ABSTRACT

A semiconductor device includes a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

20 Claims, 9 Drawing Sheets

Related U.S. Application Data continuation of application No. 14/060,607, filed on Oct. 22, 2013, now Pat. No. 9,223,519.

(56) References Cited

U.S. PATENT DOCUMENTS

| | | |
|---|---|---|
| 2009/0154032 A1 | 6/2009 | Freitag |
| 2011/0140217 A1 | 6/2011 | Nguyen et al. |
| 2012/0069642 A1 | 3/2012 | Ueda et al. |
| 2012/0315707 A1 | 12/2012 | Nam |

ELECTRONIC DEVICES HAVING SEMICONDUCTOR MAGNETIC MEMORY UNITS

CROSS-REFERENCE TO RELATED APPLICATIONS

The present application is a divisional of, and claims priority and benefits of, U.S. patent application Ser. No. 14/981,706, published as US 2016/0118575, entitled "ELECTRONIC DEVICES HAVING SEMICONDUCTOR MAGNETIC MEMORY UNITS," and filed on Dec. 28, 2015, which is a continuation of, and claims priority and benefits of, U.S. patent application Ser. No. 14/060,607, published as US 2014/0250244, entitled "ELECTRONIC DEVICES HAVING SEMICONDUCTOR MAGNETIC MEMORY UNITS," and filed on Oct. 22, 2013, now U.S. Pat. No. 9,223,519, which further claims priority of Korean Patent Application No. 10-2013-0022810, entitled "SEMICONDUCTOR DEVICE AND METHOD FOR FABRICATING THE SAME, AND MICROPROCESSOR, PROCESSOR, SYSTEM, DATA STORAGE SYSTEM AND MEMORY SYSTEM INCLUDING THE SEMICONDUCTOR DEVICE" and filed on Mar. 4, 2013. The contents of the before-mentioned patent applications (including US 2016/0118575) are incorporated herein by reference in their entirety as part of the disclosure of this document.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an improved patterning of a resistance variable element is provided to improve the characteristics of the resistance variable element.

In one aspect, an electronic device is provided to include a semiconductor memory unit that includes: a resistance variable element including a free magnetic layer, a tunnel barrier layer and a pinned magnetic layer that are configured so that the tunnel barrier layer is between the free magnetic layer and the pinned magnetic layer; a first electrical contact layer that is in electrical contact with the resistance variable element under the resistance variable element; a second electrical contact layer that is in electrical contact with the resistance variable element over the resistance variable element, wherein the first and second electrical contacts collectively apply an electrical signal to the resistance variable element; and a magnetic correction layer located over the second electrical contact so that the second electrical contact is between the magnetic correction layer and the resistance variable element, wherein the magnetic correction layer is electrically insulated from the second electrical contact and is configured to exhibit a magnetization direction which is opposite to a magnetization direction of the pinned magnetic layer to offset an influence of a magnetic field of the pinned magnetic layer to the free magnetic layer.

Implementations of the above electronic device may include one or more the following.

The semiconductor memory unit may include: a conductive line disposed between the magnetic correction layer and the second electrical contact layer and electrically coupled to the resistance variable element, wherein the magnetic correction layer is separated from and is electrically insulated from the conductive line. The magnetization directions of the pinned magnetic layer, the magnetic correction layer and the free magnetic layer may be perpendicular to surfaces of the pinned magnetic layer, the magnetic correction layer and the free magnetic layer. The magnetic correction layer may have a width in a direction parallel to its surface which is smaller than a width in a direction perpendicular to its surface. The magnetic correction layer may have a pattern that spatially overlaps with the resistance variable element. The semiconductor memory unit may include: one or more additional resistance variable elements identically constructed as the resistance variable element and arranged to form a 2-dimensional array with the resistance variable element, and wherein the magnetic correction layer overlaps with at least two resistance variable elements of the 2-dimensional array. The magnetic correction layer may include a first ferromagnetic substance layer, a noble metal layer and a second ferromagnetic substance layer which are sequentially stacked. The semiconductor memory unit may include a dielectric layer interposed between the resistance variable element and the magnetic correction layer. The semiconductor memory unit may include a dielectric layer interposed between the conductive line and the magnetic correction layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, a method is provided for fabricating an electronic device having a semiconductor memory unit. This method includes: forming a first stack of layers over a substrate to include a free magnetic layer, a tunnel barrier layer and a pinned magnetic layer; patterning the first stack of layer to form an array of columns that are separated from one another, each column including a portion of the pinned magnetic layer, the tunnel barrier layer and the free magnetic layer to form a resistance variable element such that the array of columns forms a resistance variable element array; subsequent to the patterning of the first stack of layers, forming a second stack of layers over the array of columns, wherein the second stack of layers includes an electrical insulation layer and a magnetic correction layer formed over the electrical insulation layer and exhibits a magnetization along a direction which is opposite to a magnetization direction of the pinned magnetic layer in each column to offset an influence of a magnetic field of the pinned magnetic layer to the free magnetic layer.

Implementations of the above method may include one or more of the following.

The method may further include: before forming the second stack of layers, forming a conductive line over the array of columns as the resistance variable element array to be electrically coupled to the resistance variable element, wherein the magnetic correction layer in the subsequently formed second stack of layers is formed over the conductive line and is separated and electrically insulated from the conductive line.

The forming of the magnetic correction layer may include: forming a dielectric layer over the resistance variable element; forming a substance layer for the magnetic correction layer, over the dielectric layer; and selectively etching the substance layer.

The forming of the magnetic correction layer may include: forming a dielectric layer over the resistance variable element; selectively etching the dielectric layer to a depth that allows a part of the dielectric layer to remain under the magnetic correction layer to define a space in which the magnetic correction layer is to be formed; and forming a substance layer for the magnetic correction layer, in the space.

In another aspect, an electronic device can be provided to include a semiconductor memory unit that includes: a substrate; an array of columns separated from one another and formed over the substrate, each column including a resistance variable element that further includes a free magnetic layer, a tunnel barrier layer and a pinned magnetic layer; a conductor formed over the array of columns in electrical contact with one or more of the columns; an electrical insulation material formed over the conductor; and a magnetic correction layer formed over the electrical insulation material and electrically insulated from the conductor, the magnetic correction layer configured to exhibit a magnetization along a direction which is opposite to a magnetization direction of the pinned magnetic layer to offset an influence of a magnetic field of the pinned magnetic layer to the free magnetic layer.

Implementations of the above electronic device may include one or more of the following.

The magnetization directions of the pinned magnetic layer, the magnetic correction layer and the free magnetic layer may be perpendicular to surfaces of the pinned magnetic layer, the magnetic correction layer and the free magnetic layer. The magnetic correction layer may have a width in a direction parallel to its surface which is smaller than a width in a direction perpendicular to its surface. The magnetic correction layer may be patterned to include separated magnetic correction elements that spatially correspond to and overlap with the resistance variable elements, respectively, one magnetic correction element per one resistance variable element. The magnetic correction layer may overlap with at least two resistance variable elements. The magnetic correction layer may include a first ferromagnetic substance layer, a noble metal layer and a second ferromagnetic substance layer which are sequentially stacked. The electronic device may include a dielectric layer interposed between the resistance variable element and the magnetic correction layer.

Additional technical features include the following. In one implementation, a semiconductor device may include: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

In another implementation, a method for fabricating a semiconductor device may include: forming a free magnetic layer, a tunnel barrier layer and a pinned magnetic layer over a substrate; selectively etching the pinned magnetic layer, the tunnel barrier layer and the free magnetic layer to form a resistance variable element; and forming a magnetic correction layer over the resistance variable element to be separated from the pinned magnetic layer and have a magnetization direction which is opposite to a magnetization direction of the pinned magnetic layer.

In another implementation, a microprocessor may include: a control unit configured to receive a signal including a command from an outside, and performs extraction, decoding, and controlling input and output of the command; an operation unit configured to perform an operation according to a result that the control unit decodes the command; and a memory unit configured to store at least one of data for performing the operation, data corresponding to a result of performing the operation, and an address of data for which the operation is performed, the memory unit including: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

In another implementation, a processor may include: a core unit configured to perform, according to a command inputted from an outside, an operation corresponding to the command, by using data; a cache memory unit configured to store at least one of data for performing the operation, data corresponding to a result of performing the operation, and an address of data for which the operation is performed; and a bus interface connected between the core unit and the cache memory unit, and configured to transmit data between the core unit and the cache memory unit, the cache memory unit including: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

In another implementation, a system may include: a processor configured to decode a command inputted from an outside and control an operation for information according to a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, at least one of the auxiliary memory device and the main memory device including: a resistance variable element including a free magnetic layer, a tunnel barrier layer and a pinned magnetic layer, and a magnetic correction layer disposed over the resistance variable element to be separated from the resistance variable element, and having a magnetization direction which is opposite to a magnetization direction of the pinned magnetic layer.

In another implementation, a data storage system may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, at least one of the storage device and the temporary storage device including: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

In yet another implementation, a memory system may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, at least one of the memory and the buffer memory including: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

These and other aspects, implementations and associated advantages are described in greater detail in the drawings, the description and the claims.

DETAILED DESCRIPTION

Figure 1:
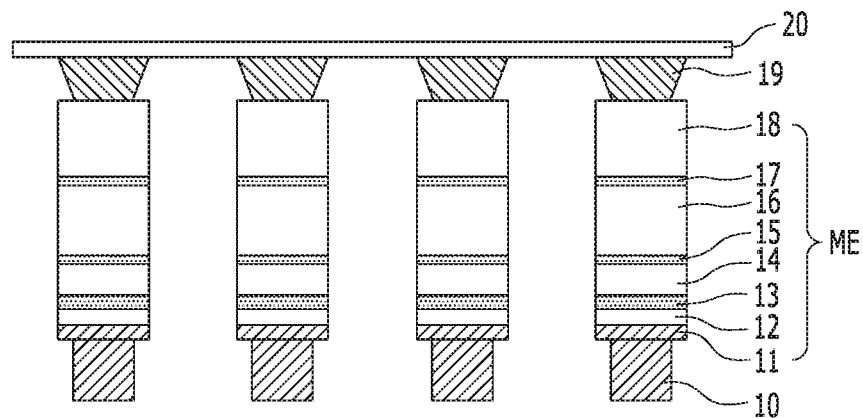
FIG. 1 is a cross-sectional view illustrating a semiconductor device having an array of magnetic resistance variable elements (MEs) formed over a substrate, where each ME is a column of stacked layers that include layers forming a magnetic tunnel junction (MTJ) element and a magnetic correction layer for reducing undesired influence of the pinned magnetic layer on the free magnetic layer in the MTJ element.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A magnetic tunnel junction (MTJ) element is an example of a resistance variable element for storing digital data based on switching between different resistance states in response to an applied voltage or current. The magnetic tunnel junction in an MTJ element includes a free magnetic layer with a changeable magnetization direction, a tunnel barrier layer and a pinned magnetic layer with a pinned magnetization direction. As explained in greater detail below, the magnetic field of the pinned magnetic layer can produce a undesired influence to the free magnetic layer. To mitigate this undesired effect, a magnetic correction layer can be implemented near the layers of the MTJ element to produce and apply a correction magnetic field to offset the undesired influence of the pinned magnetic layer on the free magnetic layer.

FIG. 1 is a cross-sectional view illustrating a semiconductor device having an array of magnetic resistance variable elements (MEs) formed over a substrate. Each ME is a column of stacked layers that include layers forming a magnetic tunnel junction (MTJ) element and a magnetic correction layer for reducing undesired influence of the pinned magnetic layer on the free magnetic layer in the MTJ element.

Referring to FIG. 1, this semiconductor device includes an array of magnetic resistance variable elements (MEs) based on switching of a free magnetic layer n each ME. The MEs are formed over a semiconductor substrate (not shown) and are interposed between first contacts 10 and second contacts 19 formed over the substrate.

Each of the first contacts 10 may be connected with one end of a predetermined circuit element which is formed on a substrate (not shown), for example, a switching element (not shown). The other end of the switching element may be connected with, for example, a source line (not shown). Also, the second contacts 19 may be connected with, for example, a bit line 20.

As a specific example, each resistance variable element ME may include an MTJ (magnetic tunnel junction) structure in which a free magnetic layer 12 with a changeable magnetization direction, a tunnel barrier layer 13 and a pinned magnetic layer 14 with a pinned magnetization direction are sequentially stacked. In such an MTJ structure, data may be stored as magnetic resistance changes according to current supplied through the first and second contacts 10 and 19. For example, the case where the magnetization direction of the free magnetic layer 12 is parallel to the magnetization direction of the pinned magnetic layer 14 may correspond to a low resistant state, and the case where the magnetization direction of the free magnetic layer 12 is opposite to the magnetization direction of the pinned magnetic layer 14 may correspond to a high resistant state.

In addition to the MTJ structure, each resistance variable element ME may further include a bottom layer 11 which is positioned under the free magnetic layer 12 and plays a predetermined role of, for example, controlling the crystallinity of the free magnetic layer 12, a top layer 18 which is positioned uppermost in the resistance variable element ME and serves as a hard mask for patterning the resistance variable element ME, and a magnetic correction layer 16 which is positioned between the pinned magnetic layer 14 and the top layer 18, has a magnetization direction opposite to the magnetization direction of the pinned magnetic layer 14 and prevents deflection of a magnetic field. First and second magnetic insulation layers 15 and 17 for magnetic insulation may be respectively positioned under and over the magnetic correction layer 16. In the design in FIG. 1, the magnetic correction layer 16 is located within each ME multi-layer stack between the top and bottom contact layers 11 and 18 for each ME element. The function of the magnetic correction layer 16 is to offset the undesired influence of the pinned magnetic layer 14 on the free magnetic layer 12 and is further explained below.

Assuming that the magnetic correction layer 16 is not present in the device in FIG. 1, the magnetic field applied by the pinned magnetic layer 14 can influence the free magnetic layer 12 so that a phenomenon occurs in which a magnetic field is deflected. Due to this influence, a problem is caused in that an asymmetrical switching characteristic results on the basis of the case where there is no magnetic field during the operation of a semiconductor device. The device in FIG. 1 uses the magnetic correction layer 16 with the magnetization direction opposite to the magnetization direction of the pinned magnetic layer 14 to offset this undesired influence by the pinned magnetic layer 14 so that the influence exerted on the free magnetic layer 12 by the magnetic field of the pinned magnetic layer 14 may be reduced below an acceptable level and thus improve the performance of the MTJ.

For practical memory devices, it is desirable to reduce the lateral dimension along the layers of each resistance variable element ME in the semiconductor device shown in FIG. 1 so as to increase the number of the MEs for a given area on the substrate and to increase the degree of integration. This reduction in the lateral dimension of each ME can reach a degree at which the influence of the magnetic field of the pinned magnetic layer 14 on the free magnetic layer 12 increases, thus increasing the probability of the undesired deflection of a magnetic field in the free magnetic layer. To mitigate this problem, the thickness of the magnetic correction layer 16 in each ME can be increased to enhance the offset effect of the magnetic field of the magnetic correction layer 16 in the free magnetic layer 12 with respect to the magnetic field of the pinned magnetic layer 14. Nevertheless, since there is a limit in a thickness of the magnetic correction layer 16 that can be etched using the top layer 18, and the patterning of the resistance variable element ME becomes difficult as the thickness of the magnetic correction layer 16 increases.

Therefore, in the semiconductor device of FIG. 1 where each ME has its own magnetic correction layer 16 within the stack of layers for the ME, as the thickness of the magnetic correction layer 16 increases to have a sufficient thickness for adequately offsetting the undesired influence of the pinned magnetic layer 14 in the free magnetic layer 12, the pattering of the resistance variable element ME becomes difficult due to the presence of this overly thick magnetic correction layer in the ME column and presents a problem in fabricating highly integrated ME arrays with small lateral dimensions while maintaining reliable performance. On the other hand, if the thickness of the magnetic correction layer 16 is decreased from a sufficient thickness that can adequately offset the undesired influence of the pinned magnetic layer 14 in the free magnetic layer 12 in order to alleviate the technical difficulty of fabricating an ME column, it would be difficult to secure desired characteristics of such a semiconductor device in FIG. 1. Therefore, given the configuration of the individual ME columns in FIG. 1 where the magnetic correction layer 16 is part of each individual ME column and is patterned along with the MTJ layers, solving one of those two problems would create the other and it is difficult to simultaneously solving both problems.

In recognition of the above, the examples of semiconductor devices disclosed below are implemented by using a structure that separates the fabrication of the layers for the MTJ junctions in individual ME columns from the fabrication of the layers having the magnetic correction layer so that a sufficiently thick magnetic correction layer can be achieved without compromising the performance of ME columns with sufficiently small lateral dimensions for highly integrated ME column arrays. Specifically, the sufficiently thick magnetic correction layer is fabricated after completion of depositing and patterning layers for a MTJ junction and associated top and bottom electrical contacts so that the thickness of the magnetic correction layer no longer affects making ME columns with small lateral dimensions.

Figure 6:
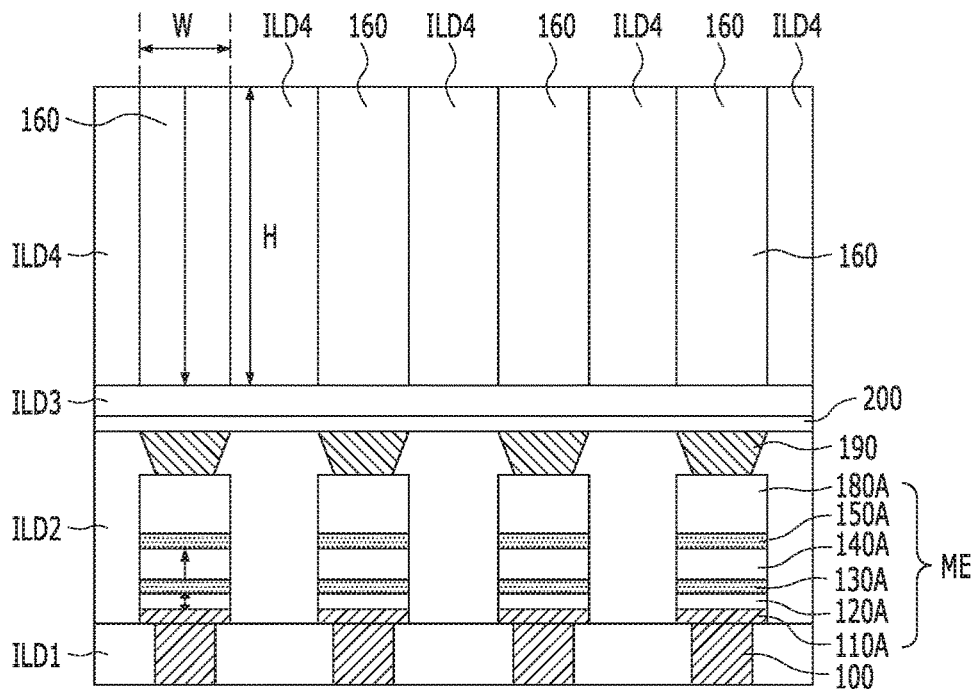
FIG. 6 shows a cross-sectional view of the patterning of the magnetic correction layer formed over the bit line conductor layer based on a further processing of the MTJ structure shown in FIG. 4.
Figure 7A:
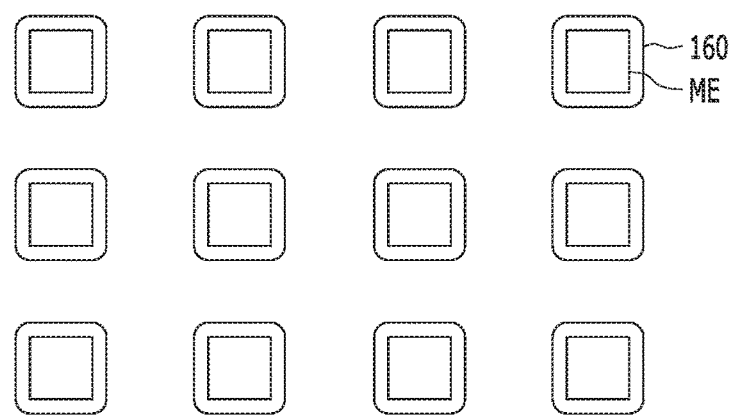
FIG. 7A shows a plan view illustrating one example of a pattern of the magnetic correction layer formed over the bit line conductor layer based on a further processing of the MTJ structure in the semiconductor device in FIG. 6 where the magnetic correction layer is patterned into individual ME magnetic correction patches, one patch per ME element or MTJ stack.

FIGS. 2 to 5 are cross-sectional views illustrating an example of the fabrication process for fabricating a semiconductor device design that separates the fabrication of the layers for the MTJ junctions in individual ME columns from the fabrication of the layers having the magnetic correction layer. In detail, FIGS. 6, 7A, 7B and 7C show examples of patterns of the magnetic correction layer in the MTJ device in FIGS. 2 to 5. For the sake of convenience in explanation, the resistance variable elements and the magnetic correction layer of FIG. 6 are shown in FIG. 7A.

Figure 2:
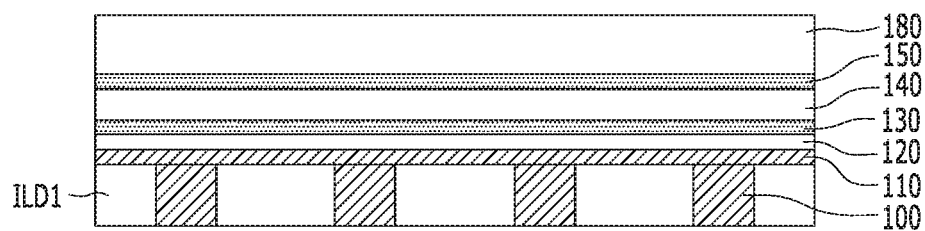
FIG. 2 shows a cross-sectional view of initial semiconductor layers during fabrication of an example of a semiconductor device having magnetic tunnel junction (MTJ) stacks each including a MTJ element and a magnetic correction layer structure separate from the MTJ stacks for reducing undesired influence of the pinned magnetic layer on the free magnetic layer in each MTJ element in the MTJ stacks.

Referring to FIG. 2, a first interlayer dielectric layer ILD1 and first contacts 100 are formed on a substrate (not shown) which is formed with predetermined structures, for example, switching elements such as transistors. Each of the first contacts 100 passes through the first interlayer dielectric layer ILD1 and is connected with a portion of the substrate, for example, one end of each switching element. While not shown, the other end of each switching element may be electrically connected with a source line. The first interlayer dielectric layer ILD1 may include one of various dielectric substances such as a silicon oxide, and the first contacts 100 may include a conductive substance, for example, a metal such as tungsten or a metal nitride such as a titanium nitride.

A bottom layer 110, a free magnetic layer 120, a tunnel barrier layer 130, a pinned magnetic layer 140, a magnetic insulation layer 150 and a top layer 180 may be sequentially formed to form resistance variable elements on the first interlayer dielectric layer ILD1 and the first contacts 100.

The bottom layer 110 is electrically connected with the first contacts 100 and may play a role required in resistance variable elements, for example, the role of controlling the crystallinity of the magnetic layer positioned thereon. While the bottom layer 110 may be a single layer or a multi-layer including a metal such as Ti, Hf, Zr, Mn, Cr, Zn, Mg, Al, W and Ta, a nitride of the metal or an oxide of the metal, implementations of the disclosed technology are not limited to such exemplifications and may include various conductive substances.

The free magnetic layer 120 is a layer of which the magnetization direction may be changed. While the free magnetic layer 120 may be a single layer or a multi-layer including a ferromagnetic substance, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy or a Co—Ni—Pt alloy and may further include an impurity such as boron (B), implementations of the disclosed technology are not limited to such exemplifications.

The pinned magnetic layer 140 is a layer of which the magnetization direction is pinned. The pinned magnetic layer 140 may be a single layer or a multi-layer including a Co metal, an Fe metal, an Fe—Pt alloy, an Fe—Pd alloy, a Co—Pd alloy, a Co—Pt alloy, a Co—Fe alloy, an Fe—Ni—Pt alloy, a Co—Fe—Pt alloy or a Co—Ni—Pt alloy, and may further include an impurity such as boron (B). Furthermore, in the case where the pinned magnetic layer 140 is a multi-layer including at least two ferromagnetic substance layers, a noble metal layer such as platinum (Pt) and palladium (Pd) may be interposed between the ferromagnetic substance layers. For example, the pinned magnetic layer 140 may have the stack structure of a ferromagnetic substance layer/a noble metal layer/a ferromagnetic substance layer. However, implementations of the disclosed technology are not limited to such an exemplification.

The tunnel barrier layer 130 is a layer which allows tunneling of electrons and thus a change in the magnetization direction of the free magnetic layer 120. While the tunnel barrier layer 130 may be a single layer or a multi-layer including an oxide of, for example, $Al_2O_3$, MgO, CaO, SrO, TiO, VO or NbO, implementations of the disclosed technology are not limited to such exemplifications.

The magnetic insulation layer 150 is positioned on the pinned magnetic layer 140, may plays the role of providing magnetic insulation, and may include a conductive substance such as a metal.

The top layer 180 is electrically connected with second contacts which will be described below, and may serve as an etch barrier during a process of etching the underlying layers, that is, the layers from the bottom layer 110 to the magnetic insulation layer 150. The top layer 180 may be a single layer or a multi-layer including a conductive substance, for example, a metal, a metal oxide or a metal nitride.

Figure 3:
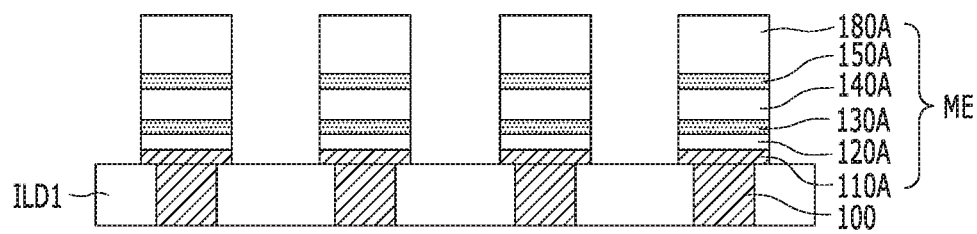
FIG. 3 shows a cross-sectional view of patterned magnetic tunnel junction (MTJ) stacks each including a MTJ element before forming the magnetic correction layer structure subsequent to the fabrication step in FIG. 2.

Referring to FIG. 3, after forming, on the top layer 180, mask patterns (not shown) for patterning of resistance variable elements, top layer patterns 180A are formed by etching the top layer 180 using the mask patterns as etch barriers.

By etching the magnetic insulation layer 150, the pinned magnetic layer 140, the tunnel barrier layer 130, the free magnetic layer 120 and the bottom layer 110 using the top layer patterns 180A as etch barriers, resistance variable elements ME in which bottom layer patterns 110A, free magnetic layer patterns 120A, tunnel barrier layer patterns 130A, pinned magnetic layer patterns 140A, magnetic insulation layer patterns 150A and top layer patterns 180A are stacked are formed. The resistance variable elements ME are formed to be connected with the first contacts 100, respectively.

Figure 4:
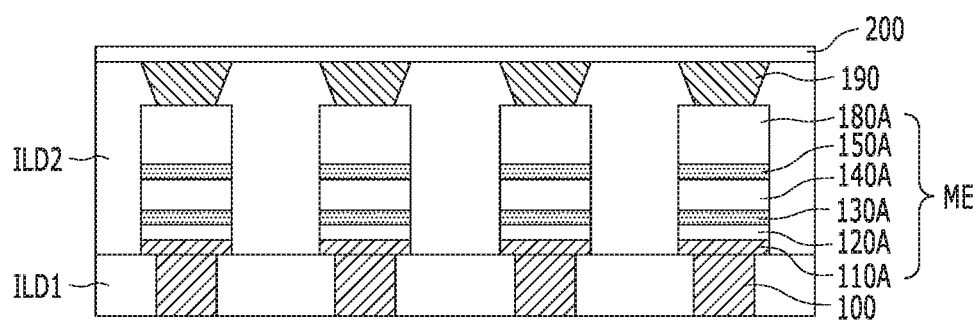
FIG. 4 shows a cross-sectional view of patterned magnetic tunnel junction (MTJ) stacks with a top contact layer in each MTJ stack and a bit line conductor layer over the MTJ stacks in FIG. 3 before forming the magnetic correction layer structure.

Referring to FIG. 4, a second interlayer dielectric layer ILD2 is formed to cover the resultant processed structure of FIG. 3.

After defining contact holes which expose the upper surfaces of the resistance variable elements ME, by selectively etching the second interlayer dielectric layer ILD2, second contacts 190 which are respectively connected with the resistance variable elements ME are formed by filling a conductive substance in the contact holes.

Bit lines 200 are formed on the second interlayer dielectric layer ILD2 to be connected with the second contacts 190 and extend in one direction.

Figure 5:
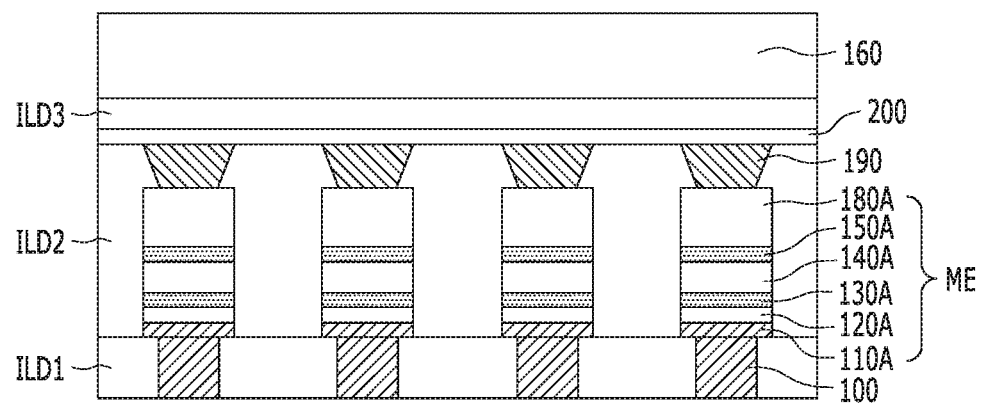
FIG. 5 shows a cross-sectional view of the magnetic correction layer structure.

Referring to FIG. 5, a magnetic correction layer 160 is formed over the bit lines 200 such that the magnetic correction layer 160 is separated and insulated from the bit lines 200 with a third interlayer dielectric layer ILD3 interposed therebetween and overlaps with the resistance variable elements ME. During the fabrication, the magnetic correction layer 160 and the underlying third interlayer dielectric layer ILD3 are formed as common layers cover the adjacent resistance variable elements ME. As such, the formation of the magnetic correction layer 160 and the underlying third interlayer dielectric layer ILD3 is separated from the formation and separation of the MTJ layers and the top and bottom contact layers for resistance variable elements ME. Accordingly, different form the MTJ structure in FIG. 1, the technical issues in connection with the formation of the individual multi-layer stacks for the individual resistance variable elements ME are separated from formation of the magnetic correction layer 160 in the MTJ structure fabricated based on the processes in FIGS. 2-5. The magnetic correction layer 160 has a magnetization direction opposite to that of the pinned magnetic layer patterns 140A, and plays the role of offsetting the influences exerted on the free magnetic layer patterns 120A by the magnetic fields of the pinned magnetic layer patterns 140A. The magnetic correction layer 160 may be a single layer or a multi-layer including a ferromagnetic substance, for example, a Co metal, an Fe metal, an Fe—Pt alloy, an Fe—Pd alloy, a Co—Pd alloy, a Co—Pt alloy, an Fe—Ni—Pt alloy, a Co—Fe—Pt alloy or a Co—Ni—Pt alloy. Furthermore, in the case where the magnetic correction layer 160 is a multi-layer including at least two ferromagnetic substance layers, a noble metal layer such as platinum (Pt) and palladium (Pd) may be interposed between the ferromagnetic substance layers. For example, the magnetic correction layer 160 may have the stack structure of a ferromagnetic substance layer/a noble metal layer/a ferromagnetic substance layer.

The magnetic correction layer 160 may be formed by forming the third interlayer dielectric layer ILD3 and a substance layer for forming the magnetic correction layer 160, on the resultant processed structure of FIG. 4 or 5, and then selectively etching the substance layer. After the magnetic correction layer 160 is formed as shown in FIG. 5, a dielectric substance can be formed to cover the magnetic correction layer 160. Subsequently, a planarization process can be formed. In some designs, the magnetic correction layer 160 may be subsequently patterned depending on the specific application needs.

FIG. 6 shows an example of a patterned magnetic correction layer 160 with separate areas corresponding to different MTJ stacks or columns, respectively and a fourth interlayer dielectric layer ILD4 may be formed to fill the spaces between the patterns of the magnetic correction layer 160.

Alternatively, the magnetic correction layer 160 may be formed by forming third and fourth interlayer dielectric layers ILD3 and ILD4 on the resultant processed structure of FIG. 4, selectively etching the third and fourth interlayer dielectric layers ILD3 and ILD4 to define spaces in which the magnetic correction layer 160 is to be formed, and filling a substance layer for forming the magnetic correction layer 160, in the spaces. The third and fourth interlayer dielectric layers ILD3 and ILD4 may constitute a single layer which is formed of the same substance. When etching the third and fourth interlayer dielectric layers ILD3 and ILD4, an etching depth may be controlled such that at least a partial depth of the third and fourth interlayer dielectric layers ILD3 and ILD4 remains under the magnetic correction layer 160.

Referring again to FIG. 6, the resistance variable elements ME are interposed between the first contacts 100 and the second contacts 190. Each of the resistance variable elements ME may include an MTJ structure in which at least the free magnetic layer pattern 120A, the tunnel barrier layer pattern 130A and the pinned magnetic layer pattern 140A are sequentially stacked. Each resistance variable element ME may further include the bottom layer pattern 110A under the MTJ structure, the top layer pattern 180A over the MTJ structure, and the magnetic insulation layer pattern 150A which is interposed between the top layer pattern 180A and the MTJ structure. Notably, unlike the example in FIG. 1 where the magnetic correction layer 16 is located within each ME multi-layer stack between the top and bottom contact layers 11 and 18 for each ME element, the resistance variable element ME according to the present implementation does not include a magnetic correction layer between the top and bottom contact layers 190 and 100 for each ME element and instead the magnetic correction layer 160 is formed as a common magnetic correction layer after formation of the multi-layer structures between the top and bottom contact layers 190 and 100 and patterning of the multi-layer structures and the top and bottom contact layers 190 and 100 into individual ME elements. This aspect Each pattern of the magnetic correction layer 160 is formed to be disposed adjacent to the pinned magnetic layer pattern 140A between two magnetic layer patterns, that is, the free magnetic layer pattern 120A and the pinned magnetic layer pattern 140A, and to be spatially and electrically isolated from the pinned magnetic layer pattern 140A. In the present implementation, the magnetic correction layer 160 may be disposed on the third interlayer dielectric layer ILD3 which covers the bit lines 200.

The patterns of the magnetic correction layer 160 and the resistance variable elements ME may one-to-one correspond to each other when viewed on a plane. In other words, the respective patterns of the magnetic correction layer 160 may overlap with the respective resistance variable elements ME. The plane means a surface which is parallel to the substrate and is parallel to the surfaces of the respective layers. While it is illustrated in FIG. 7A that the plane size of each pattern of the magnetic correction layer 160 is larger than the plane size of the resistance variable element ME, the present implementation is not limited to such an exemplification, and the plane size of each pattern of the magnetic correction layer 160 may be equal to or smaller than the plane size of the resistance variable element ME.

In the present implementation, the free magnetic layer pattern 120A, the pinned magnetic layer pattern 140A and the pattern of the magnetic correction layer 160 may have magnetization directions which are perpendicular to a plane direction. Namely, the magnetization direction of the free magnetic layer pattern 120A may be any one of an upward direction and a downward direction, and, when the magnetization direction of the pinned magnetic layer pattern 140A is, for example, an upward direction, the magnetization direction of the pattern of the magnetic correction layer 160 may be a downward direction. The magnetization directions of the free magnetic layer pattern 120A, the pinned magnetic layer pattern 140A and the pattern of the magnetic correction layer 160 are exemplarily shown by arrows in corresponding layers. As the aspect ratio of the magnetic correction layer 160 is large, a merit is provided for the magnetic correction layer 160 to have a vertical magnetization direction. Therefore, a height H of the pattern of the magnetic correction layer 160 may be larger than a width W of the pattern of the magnetic correction layer 160.

The following effects are accomplished by the semiconductor device and the method for fabricating the same which are described above.

First, because the resistance variable element ME and the pattern of the magnetic correction layer 160 are formed to be separated from each other, the total thickness of the resistance variable element ME may be reduced, and thus, patterning becomes easy.

In addition, since the magnetic correction layer 160 is formed over the bit lines 200, the thickness of the magnetic correction layer 160 may be increased as desired. Accordingly, even though the plane size of the resistance variable element ME is decreased, a semiconductor device with desired characteristics may be secured by increasing the thickness of the magnetic correction layer 160.

While it is illustrated in the above-described implementation in FIGS. 6 and 7A that the patterns of the magnetic correction layer 160 and the resistance variable elements ME one-to-one correspond to each other, the magnetic correction layer 160 may be patterned in other configurations. The patterns of the magnetic correction layer 160 and the resistance variable elements ME may one-to-many correspond with each other, which is exemplarily shown in FIGS. 7B and 7C.

Figure 7B:
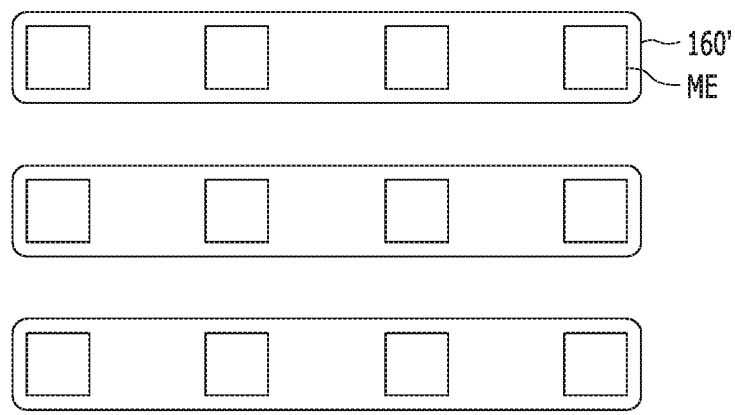
FIGS. 7B and 7C are plan views illustrating two additional examples of the patterns of the magnetic correction layer formed over the bit line conductor layer in semiconductor devices having magnetic tunnel junction (MTJ) stacks and a magnetic correction layer structure separate from the MTJ stacks based on further processing of the MTJ structure in FIG. 5.
Figure 7C:
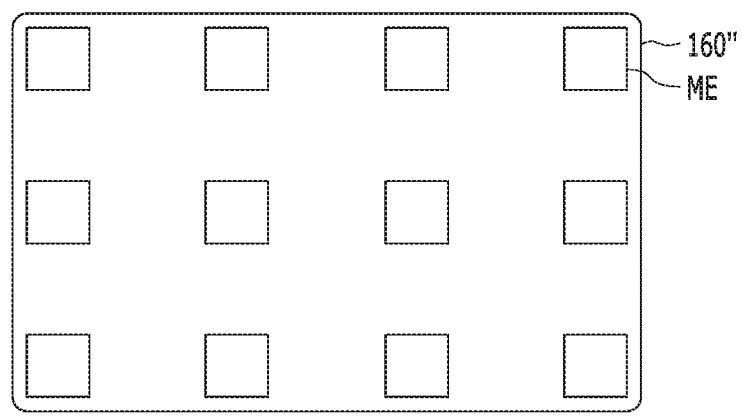

FIGS. 7B and 7C are plan views illustrating semiconductor devices having magnetic tunnel junction (MTJ) stacks and a magnetic correction layer structure separate from the MTJ stacks based on two different examples of various geometrical configurations for the magnetic correction layer structure.

Referring to FIG. 7B, each pattern of a magnetic correction layer 160' may overlap with at least two resistance variable elements ME among entire resistance variable elements ME. While it is illustrated in the present implementation that each pattern of the magnetic correction layer 160' has a bar-like shape when viewed on a plane, each pattern of the magnetic correction layer 160' may have various shapes so long as it overlaps with at least two resistance variable elements ME.

Referring to FIG. 7C, each pattern of a magnetic correction layer 160" may have a plate-like shape which overlaps with entire resistance variable elements ME. In this case, patterning of the magnetic correction layer 160" may not be required.

The above and other memory circuits or semiconductor devices based on the disclosed technology can be used in a range of devices or systems. FIGS. 8-12 provide some examples of devices or systems that can implement the memory circuits disclosed herein.

Figure 8:
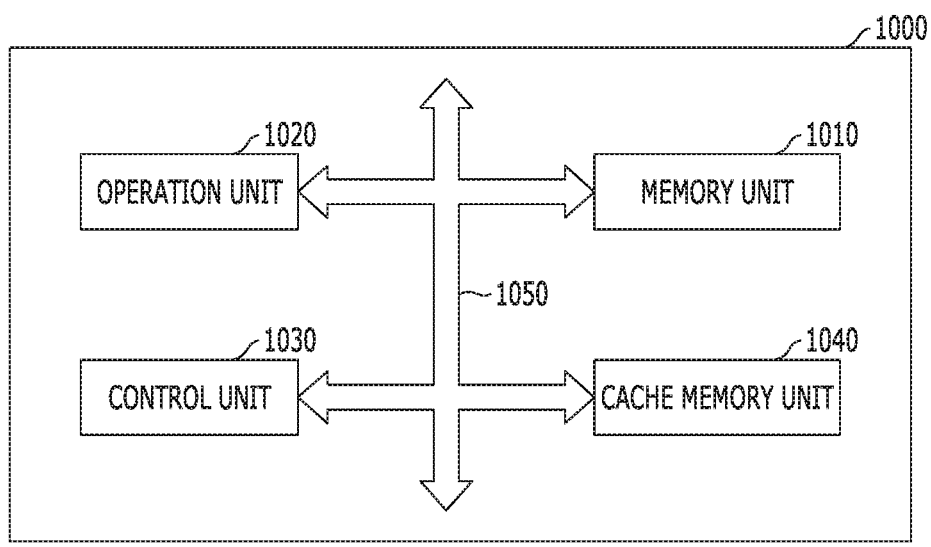
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the memory unit 1010 may become easy and the reliability of the memory unit 1010 may be improved. As a consequence, a fabrication process of the microprocessor 1000 may become easy and the reliability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
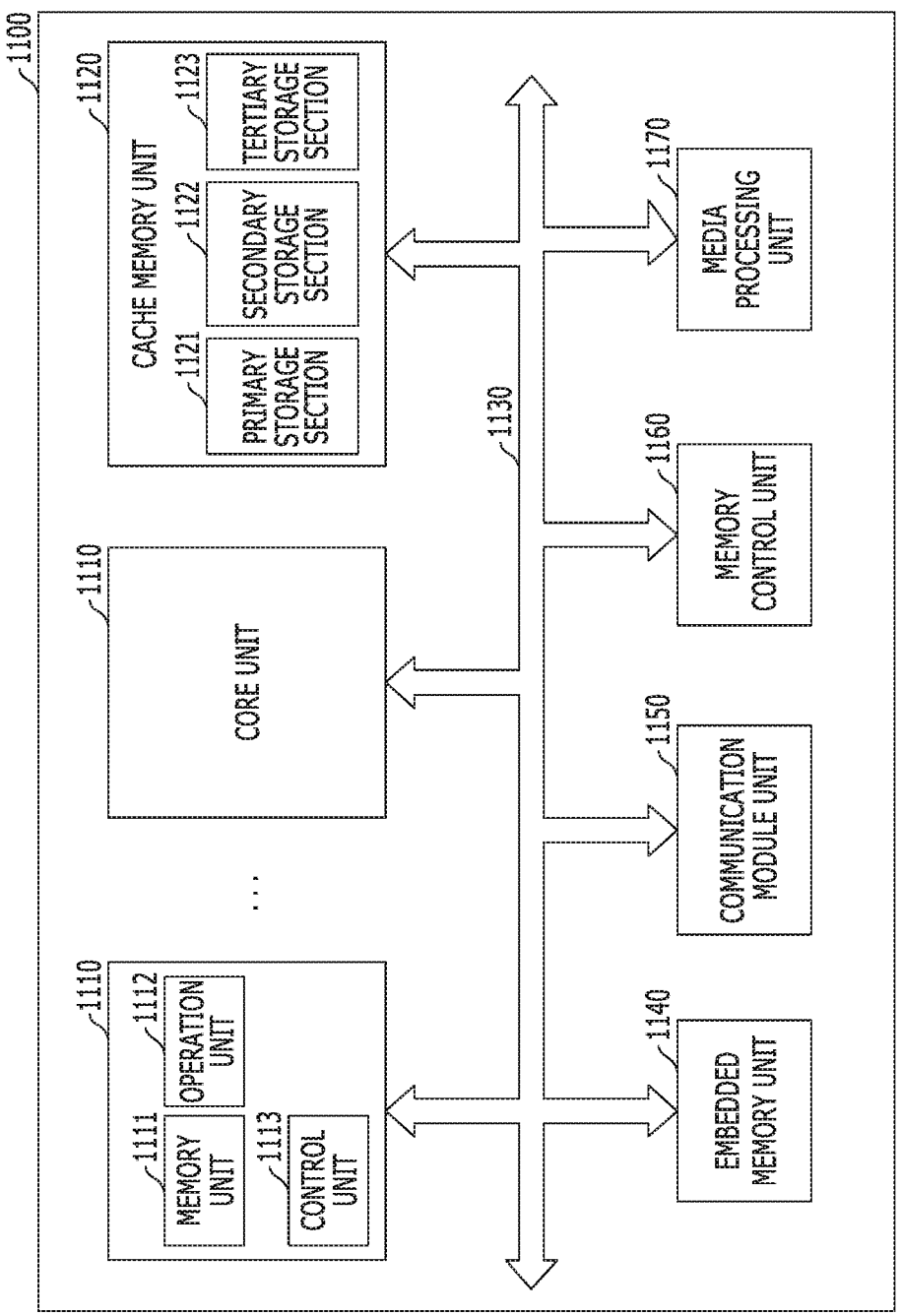
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the cache memory unit 1120 may become easy and the reliability of the cache memory unit 1120 may be improved. As a consequence, a fabrication process of the processor 1100 may become easy and the reliability of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit

1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
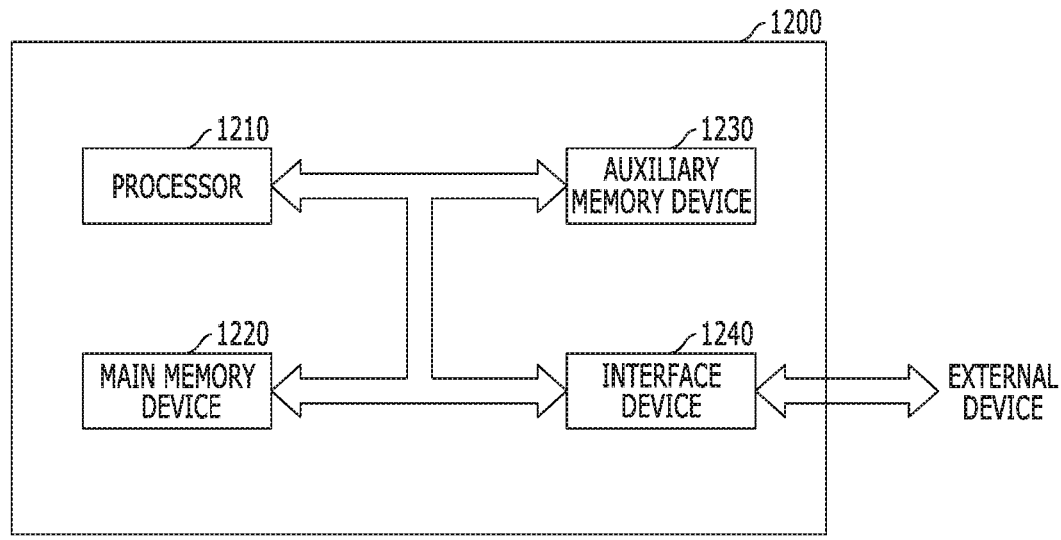
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the main memory device 1220 may become easy and the reliability of the main memory device 1220 may be improved. As a consequence, a fabrication process of the system 1200 may become easy and the reliability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the auxiliary memory device 1230 may become easy and the reliability of the auxiliary memory device 1230 may be improved. As a consequence, a fabrication process of the system 1200 may become easy and the reliability of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
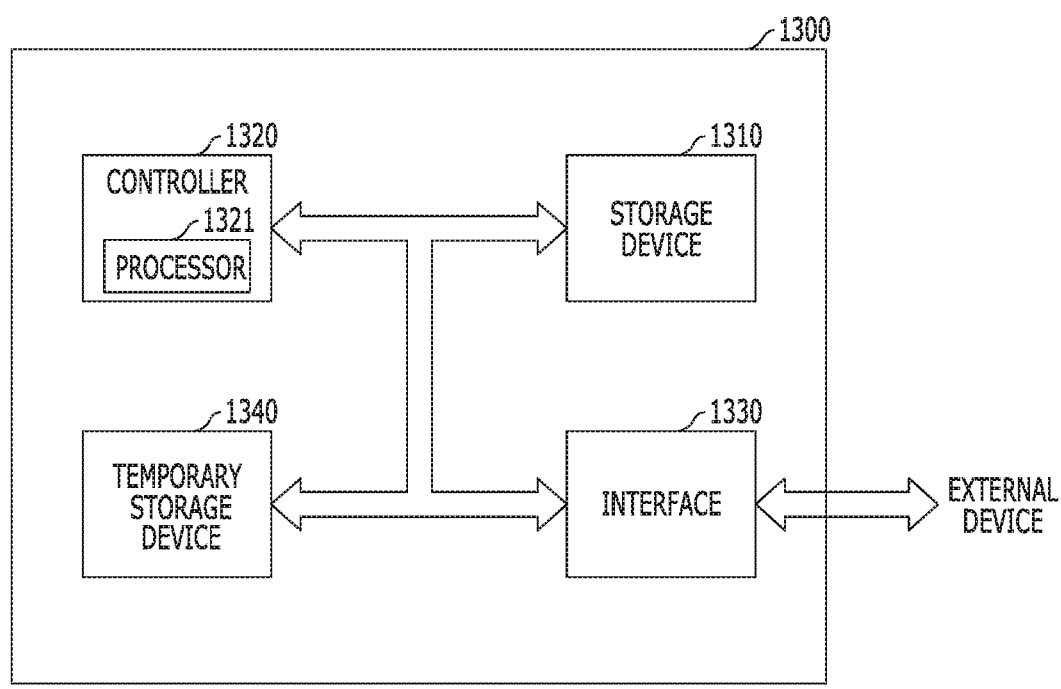
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the storage device 1310 or the temporary storage device 1340 may become easy and the reliability of the storage device 1310 or the temporary storage device 1340 may be improved. As a consequence, a fabrication process of the data storage system 1300 may become easy and the reliability of the data storage system 1300 may be improved.

Figure 12:
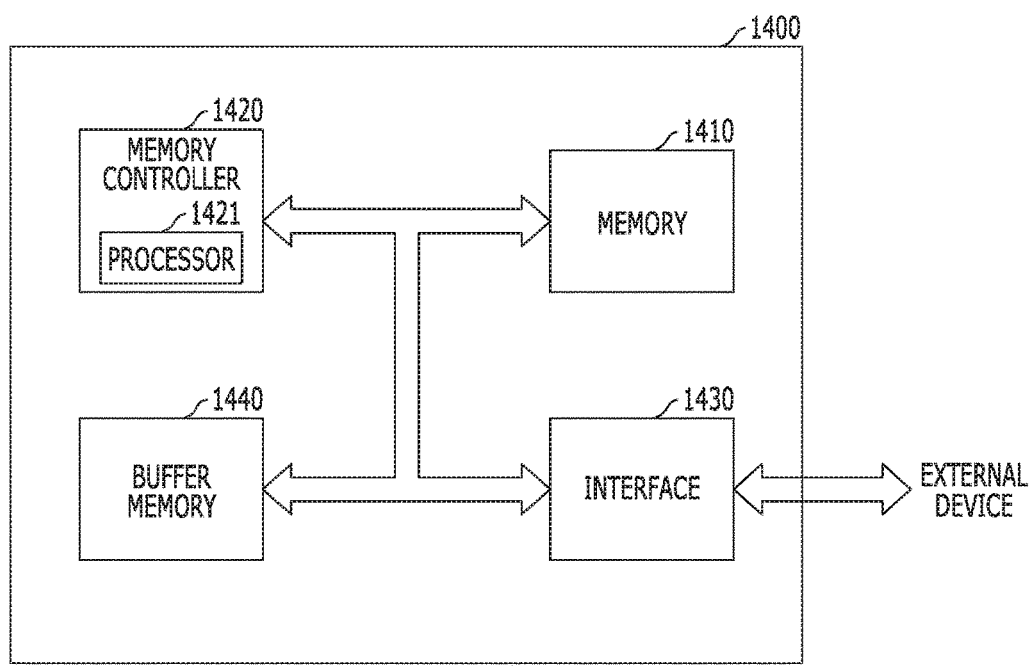
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the memory 1410 may become easy and the reliability of the memory 1410 may be improved. As a consequence, a fabrication process of the memory system 1400 may become easy and the reliability of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the buffer memory 1440 may become easy and the reliability of the buffer memory 1440 may be improved. As a consequence, a fabrication process of the memory system 1400 may become easy and the reliability of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit that includes:
   a plurality of resistance variable elements that are arranged to form a 2-dimensional array, each resistance variable element including a free magnetic layer, a pinned magnetic layer, and a tunnel barrier layer disposed between the free magnetic layer and the pinned magnetic layer; and
   a magnetic correction layer disposed over the 2-dimensional array of the resistance variable elements and structured to include a magnetic material having a magnetization direction opposite to a magnetization direction of the pinned magnetic layer, the magnetic correction layer located to be closer to the pinned magnetic layer than the free magnetic layer of each resistance variable element to offset an influence of a magnetic field of the pinned magnetic layer to the free magnetic layer,
   wherein the magnetic material of the magnetic correction layer above the 2-dimensional array of the resistance variable elements is present above each resistance variable element and is also present between the resistance variable elements, and
   wherein the magnetic correction layer is spatially and electrically separated from the resistance variable elements.

2. The electronic device according to claim 1, wherein:
   the magnetic correction layer is a contiguous layer to cover both space between resistance variable elements and the resistance variable elements.

3. The electronic device according to claim 1, wherein:
   the magnetic correction layer is a patterned layer that includes contiguous magnetic material areas each covering one or more resistance variable elements and a lateral dimension of each contiguous magnetic material area is greater than a lateral dimension of one or more resistance variable elements covered thereunder.

4. The electronic device according to claim 3, wherein:
   the contiguous magnetic material areas of the patterned layer as the magnetic correction layer include parallel bar-shaped areas.

5. The electronic device according to claim 1, further comprising:
   an electrical insulation material formed between the 2-dimensional array of the resistance variable elements and the magnetic correction layer to insulate the magnetic correction layer from the resistance variable elements.

6. The electronic device according to claim 5, further comprising:
   a conductive line formed between the 2-dimensional array of the resistance variable element and the electrical insulation material to be in electrical contact with the resistance variable element.

7. The electronic device according to claim 1, wherein the magnetic correction layer includes a ferromagnetic substance including a Co metal, an Fe metal, an Fe—Pt alloy, an Fe—Pd alloy, a Co—Pd alloy, a Co—Pt alloy, an Fe—Ni—Pt alloy, a Co—Fe—Pt alloy or a Co—Ni—Pt alloy.

8. The electronic device according to claim 1, wherein magnetization directions of the pinned magnetic layer, the magnetic correction layer and the free magnetic layer are perpendicular to surfaces of the pinned magnetic layer, the magnetic correction layer and the free magnetic layer.

9. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory unit is part of the memory unit in the microprocessor.

10. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit is part of the cache memory unit in the processor.

11. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside, wherein the semiconductor memory unit is part of the auxiliary memory device or the main memory device in the processing system.

12. The electronic device according to claim 1, further comprising a data storage system which includes:
a storage device configured to store data and conserve stored data regardless of power supply;
a controller configured to control input and output of data to and from the storage device according to a command inputted from an outside;
a temporary storage device configured to temporarily store data exchanged between the storage device and the outside; and
an interface configured to perform communication between at least one of the storage device, the controller and the temporary storage device and the outside,
wherein the semiconductor memory unit is part of the storage device or the temporary storage device in the data storage system.

13. The electronic device according to claim 1, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory unit is part of the memory or the buffer memory in the memory system.

14. The electronic device according to claim 1, further comprising:
a first electrical contact layer that is in electrical contact with the resistance variable element under the resistance variable element;
a second electrical contact layer that is in electrical contact with the resistance variable element over the resistance variable element, wherein the first and second electrical contacts collectively apply an electrical signal to the resistance variable element.

15. The electronic device according to 1, wherein the magnetic correction layer has a width in a direction parallel to a surface of the magnetic correction layer, the width being smaller than a width in a direction perpendicular to the surface of the magnetic correction layer.

16. The electronic device according to 1, wherein the magnetic correction layer overlaps with at least two resistance variable elements.

17. The electronic device according to 1, wherein the magnetic correction layer comprises a first ferromagnetic substance layer, a noble metal layer and a second ferromagnetic substance layer which are sequentially stacked.

18. The electronic device according to 1, wherein the free magnetic layer includes a ferromagnetic substance.

19. The electronic device according to claim 1, wherein at least one of the free magnetic layer and the pinned magnetic layer is configured to include multiple layers.

20. The electronic device according to claim 1, wherein the magnetic correction layer is electrically separated from the resistance variable elements by an insulation material overlapping with the resistance variable elements.

* * * * *